US007212046B2

(12) United States Patent
Hur

(10) Patent No.: US 7,212,046 B2
(45) Date of Patent: May 1, 2007

(54) POWER-UP SIGNAL GENERATING APPARATUS

(75) Inventor: Young-Do Hur, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 43 days.

(21) Appl. No.: 10/877,882

(22) Filed: Jun. 23, 2004

(65) Prior Publication Data

US 2005/0093529 A1 May 5, 2005

(30) Foreign Application Priority Data

Oct. 31, 2003 (KR) ...................... 10-2003-0076906

(51) Int. Cl.
*H03L 7/00* (2006.01)

(52) U.S. Cl. ...................................... 327/143; 327/198

(58) Field of Classification Search ................ 327/143, 327/198, 540, 541, 545, 546, 512, 513; 323/316
See application file for complete search history.

(56) References Cited

U.S. PATENT DOCUMENTS

| | | | | |
|---|---|---|---|---|
| 4,142,118 | A * | 2/1979 | Guritz | 327/72 |
| 4,800,303 | A * | 1/1989 | Graham et al. | 326/72 |
| 5,144,159 | A * | 9/1992 | Frisch et al. | 327/198 |
| 5,359,236 | A * | 10/1994 | Giordano et al. | 327/512 |
| 5,426,616 | A * | 6/1995 | Kajigaya et al. | 365/226 |
| 5,631,600 | A * | 5/1997 | Akioka et al. | 327/543 |
| 5,654,656 | A * | 8/1997 | Geannopoulos | 327/143 |
| 5,814,995 | A * | 9/1998 | Tasdighi | 324/431 |
| 5,936,443 | A * | 8/1999 | Yasuda et al. | 327/143 |
| 5,936,455 | A * | 8/1999 | Kobayashi et al. | 327/437 |
| 6,087,885 | A * | 7/2000 | Tobita | 327/379 |
| 6,160,431 | A * | 12/2000 | Crotty | 327/143 |
| 6,181,173 | B1 * | 1/2001 | Homol et al. | 327/143 |
| 6,194,944 | B1 * | 2/2001 | Wert | 327/327 |
| 6,201,378 | B1 * | 3/2001 | Eto et al. | 323/313 |
| 6,265,858 | B1 * | 7/2001 | Park | 323/313 |
| 6,360,720 | B1 * | 3/2002 | Kesler | 123/406.55 |
| 6,377,090 | B1 * | 4/2002 | Bruno | 327/143 |
| 6,426,671 | B1 * | 7/2002 | Kono | 327/541 |
| 6,429,705 | B1 * | 8/2002 | Bando et al. | 327/143 |
| 6,442,500 | B1 * | 8/2002 | Kim | 702/132 |
| 6,492,850 | B2 * | 12/2002 | Kato et al. | 327/143 |

(Continued)

FOREIGN PATENT DOCUMENTS

| | | |
|---|---|---|
| KR | 1020020056262 | 7/2002 |

*Primary Examiner*—Timothy P. Callahan
*Assistant Examiner*—Thomas J. Hiltunen
(74) *Attorney, Agent, or Firm*—Blakely Sokoloff Taylor & Zafman

(57) ABSTRACT

In a power-up signal generating device, a power-up signal is activated at a certain level of the power supply voltage VDD by adjusting the turn-on resistance value of the MOS transistor so that the chip reliability can be improved. The power-up signal generating device comprises a reference voltage generating unit, a bias level adjusting unit, a bias signal generating unit and a signal outputting unit. The reference voltage generating unit generates a reference voltage. The bias level adjusting unit receives the reference voltage as an input for controlling a voltage level of a bias signal in a constant level. The bias signal generating unit generates the bias signal under control of the bias level adjusting unit. The signal outputting unit outputs a power-up signal depending on the voltage level of the bias signal.

25 Claims, 2 Drawing Sheets

U.S. PATENT DOCUMENTS

| | | | | |
|---|---|---|---|---|
| 6,515,523 | B1 * | 2/2003 | Bikulcius | 327/142 |
| 6,661,279 | B2 * | 12/2003 | Yabe | 327/546 |
| 6,744,291 | B2 * | 6/2004 | Payne et al. | 327/143 |
| 6,816,351 | B1 * | 11/2004 | Frank et al. | 361/103 |
| 6,888,384 | B2 * | 5/2005 | Wada | 327/143 |
| 6,894,544 | B2 * | 5/2005 | Gubbins | 327/143 |
| 6,937,074 | B2 * | 8/2005 | Shin | 327/143 |
| 7,034,581 | B2 * | 4/2006 | Sudou | 327/77 |
| 2003/0099137 | A1 * | 5/2003 | Martin | 365/198 |
| 2003/0197551 | A1 * | 10/2003 | Hamamoto et al. | 327/540 |
| 2004/0036514 | A1 * | 2/2004 | Kwon | 327/143 |
| 2004/0080305 | A1 * | 4/2004 | Lin et al. | 323/312 |

* cited by examiner

POWER-UP SIGNAL GENERATING APPARATUS

FIELD OF THE INVENTION

The present invention relates to semiconductor design technique; and, more particularly, to a power-up signal generating apparatus.

BACKGROUND OF THE INVENTION

Generally, a semiconductor memory device starts its operation after a power voltage level rises up to a certain level instead of starting in response to the level of the power voltage immediately after the power voltage is externally supplied. For this reason, the semiconductor memory device usually includes a power-up circuit.

The power-up circuit prohibits the entire memory device from damaged due to latch-up when the internal circuit of the device is operated before the power voltage is stabilized after the power voltage is supplied externally so that chip level reliability can be improved. Such a power-up circuit detects the rise of the power voltage that is supplied externally when the power voltage is supplied initially so as to output a power-up signal in 'low' state till a certain level of the power voltage and then make a transition of the power-up signal to 'high' state after the power voltage is stabilized over the certain level. On the contrary, when the power voltage falls, the power-up circuit outputs the power-up signal in 'high' state till the certain level of the power voltage and then outputs the power-up signal in 'low' state again after the power voltage level falls down under the certain level. The power-up signal is outputted as 'high' after the power voltage is stabilized and operated independently in a unit of pipe within the memory inner circuit to be used mostly for circuits which require initialization operation.

FIG. 1 is a circuit diagram of a power-up signal generating apparatus in prior art.

Referring to FIG. 1, the power-up signal generating apparatus comprises a bias signal generating unit 10 for generating a bias signal bias, a sensing level adjusting unit 11 for sensing rising of a power supply voltage VDD to adjust an voltage level of an output node ND2, and an output signal forming unit 12 for outputting the voltage on the output node ND2 as a power-up signal pwrup.

The bias signal generating unit 10 includes a PMOS transistor PM1 having a ground voltage VSS as its gate input and a source-drain path between the power supply voltage VDD and a node ND1, and an NMOS transistor NM1 having a drain coupled to its gate and a drain-source path between the node ND1 and the ground voltage VSS to output the voltage on the node ND1 as the bias signal bias.

When the power supply voltage VDD exceeds the threshold voltage Vt of the NMOS transistor NM1 while rising, the NMOS transistor NM1 is turned on so as to output the bias signal bias having a certain level.

Further, the sensing level adjusting unit 11 includes two serially coupled PMOS transistors PM2, PM3 between the power supply voltage VDD and the output node ND2, each transistor having a drain coupled to the corresponding gate.

The output signal forming unit 12 includes an NMOS transistor NM2 having the bias signal as its gate input and a drain-source path between the output node ND2 and the ground voltage VSS, an inverter I1 for inverting the output node ND2, a PMOS transistor PM4 having the output signal of the inverter I1 as its gate input and a source-drain path between the power supply voltage VDD and the output node ND2, and an inverter I2 for inverting the output of the inverter I1 to output as the power-up signal pwrup Next, it will be described for the operation of the conventional power-up signal generating apparatus.

First, as the power supply voltage VDD rises up to lead rising of the voltage level on the node ND1, the NMOS transistor NM1 becomes active so that the bias signal generating unit 10 outputs the bias signal bias having a stable level. In turn, the NMOS transistor NM2 having the bias signal bias as its gate input is turned on so that the output node ND2 can has a certain portion of the power supply voltage VDD that is obtained by voltage dividing with the PMOS transistors PM2, PM3 in the sensing level adjusting unit 11 and the voltage level on the output node ND2 rises up due to the rise of the power supply voltage VDD. The inverter 11 inverts the voltage on the output node ND2. Because the PMOS transistor PM4 that has the output of the inverter I1 as its gate input inputs the power supply voltage VDD to the output node ND2 in response to falling of the output of the inverter I1 so as to increase the voltage level on the output node ND2 more rapidly. The inverter I2 inverts the output signal of the inverter I1 to output it as the power-up signal pwrup.

For the reference, the sensing level adjusting unit 11 makes the voltage level on the output node ND2 have the certain portion of the power supply voltage VDD so as to adjust the active point of the power-up signal by varying that amount of the portion. Further, the output signal forming unit 12 forms the power-up signal pwrup by using the inverter chain I1, I2 because the voltage level on the output node ND2 comes from voltage dividing of the power supply voltage VDD.

On the other hand, the conventional power-up signal generating apparatus is sensitive to surrounding temperature around the semiconductor, which will be described as follows.

FIG. 2 shows a waveform diagram for operation of a circuit in FIG. 1, which presents the active point of the power-up signal versus temperature.

First, X axis depicts time and Y axis depicts voltage. The waveform of 'b' shows the case when the surrounding temperature around the semiconductor is room temperature, 'a' shows the case when the surrounding temperature around the semiconductor is higher than room temperature, and 'c' shows the case when the surrounding temperature around the semiconductor is lower than room temperature.

Referring to FIG. 2, it can be seen that the active point of the power-up signal pwrup depends on the surrounding temperature around the semiconductor. That is, in the case of 'a' when the surrounding temperature is higher than room temperature, the power-up signal pwrup becomes active at lower voltage level than in the case of 'b'. On the contrary, in the case of 'c', the power-up signal pwrup becomes active at a higher voltage level than in the case of 'b'.

As the surrounding temperature around the semiconductor rises, the threshold voltage Vt of the MOS transistor becomes lower so that the NMOS transistor NM1 can be turned on before the power supply voltage VDD rises up enough to make the voltage level of the bias signal bias becomes lower. Accordingly, the turn-on resistance of the NMOS transistor NM2 that is controlled by the bias signal bias rises up and, in turn, the voltage on the output node ND2 is increased so that the power-up signal pwrup can be active before the power supply voltage VDD rises up enough.

On the contrary, when the surrounding temperature falls down, the threshold voltage Vt of the NMOS transistor NM1 rises up so that the voltage level of the bias signal bias becomes higher. Accordingly, the turn-on resistance of the NMOS transistor NM2 is reduced and, in turn, the voltage level on the output node ND 2 falls down so that the power-up signal becomes active at higher power supply voltage VDD.

As described above, the conventional power-up signal generating apparatus is so sensitive to the surrounding temperature around the semiconductor, which makes the power-up signal pwrup active at irregular levels of the power supply voltage VDD and, as a result, leads failure of initialization operation of a chip and deterioration of chip reliability.

When the power-up signal becomes active before the power supply voltage VDD rises up to a certain level due to rising of the surrounding temperature, chip initialization is failed. On the other hand, when the activation of the power-up signal is lagged due to falling of the surrounding temperature, the semiconductor device operates abnormally in a low voltage region.

Similarly, such phenomena as described above can be seen in case of process changes.

SUMMARY OF THE INVENTION

It is, therefore, a primary object of the present invention to provide a power-up signal generating apparatus for improving chip reliability.

In accordance with the present invention, there is provided a power-up signal generating apparatus which comprises a reference voltage generating unit for generating a reference voltage, a bias level adjusting unit receiving the reference voltage as its input for controlling a voltage level of a bias signal to have a constant level, a bias signal generating unit for generating the bias signal under control of the bias level adjusting unit; and a signal outputting unit for outputting a power-up signal depending on the voltage level of the bias signal.

BRIEF DESCRIPTION OF THE DRAWING

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, with reference to the accompanying drawings, a preferred embodiment of the present invention will be explained in detail.

In the present invention, a voltage level of a bias signal is increased when temperature rises up to reduce increase of resistance of an NMOS transistor due to rising of temperature so as to reduce impact of temperature on the power-up signal. Further, the voltage level of the bias signal is reduced when temperature falls down to reduce reduction of the resistance of the NMOS transistor due to falling of temperature. As such, the active point of the power-up signal can be adjusted.

Figure 3:
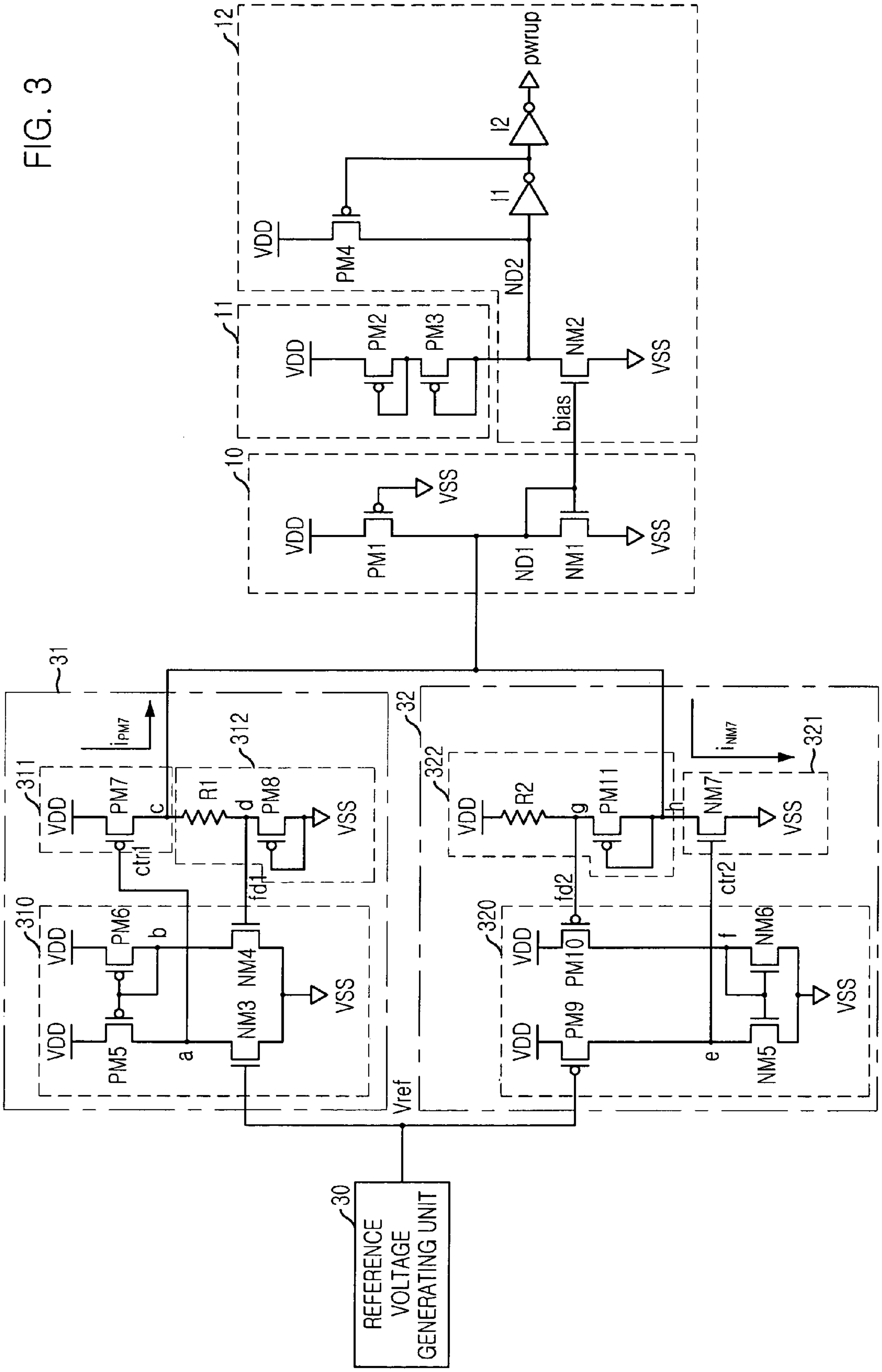
FIG. 3 represents a circuit diagram of a power-up signal generating apparatus in accordance with one embodiment of the present invention.

FIG. 3 represents a circuit diagram of a power-up signal generating apparatus in accordance with one embodiment of the present invention.

Referring to FIG. 3, the power-up signal generating apparatus comprises a reference voltage generating unit 30 for generating a reference voltage Vref, a current supplying unit 31 for receiving the reference voltage Vref and a portion of a voltage on a node ND1 of a bias signal generating unit 10 to supply a current to the node ND1, a current sinking unit 32 for receiving the reference voltage Vref and a portion of the voltage on the node ND1 to sink the current from the node ND1, the bias signal generating unit 10 for generating a bias signal bias under control of the current supplying unit 31 and the current sinking unit 32, and a sensing level adjusting unit 11 for adjusting a voltage level of an output node ND2 for sensing rising of the power supply voltage VDD, and output signal generating unit 12 for outputting the voltage on the output node ND2 as a power-up signal pwrup.

Figure 1:
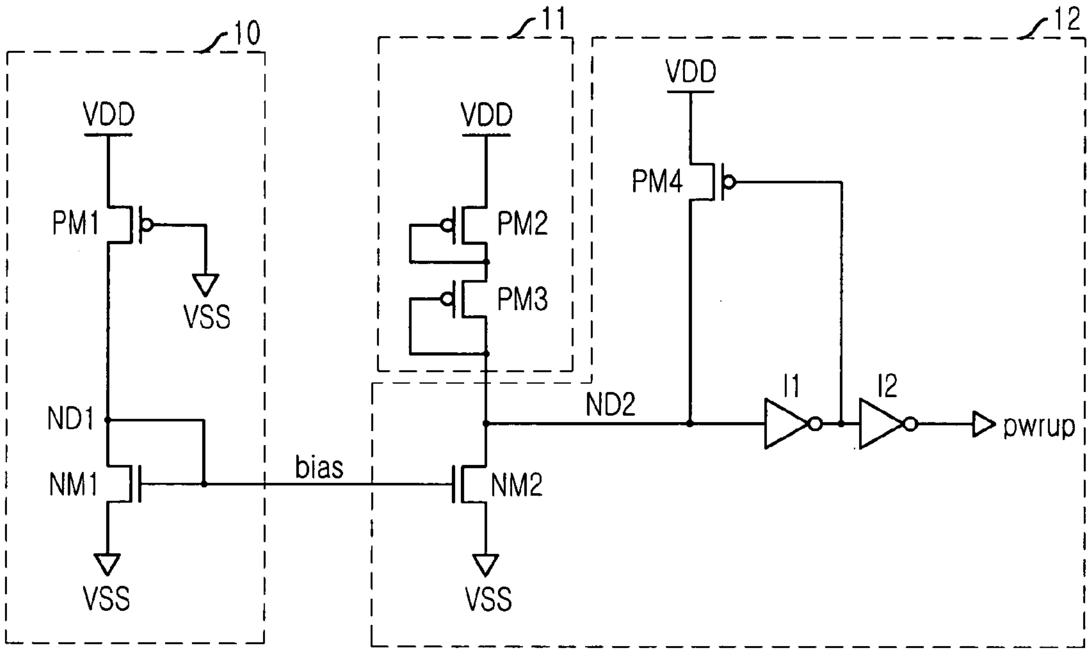
FIG. 1 (PRIOR ART)
FIG. 1 provides a circuit diagram of a power-up signal generating apparatus in prior art.
Figure 2:
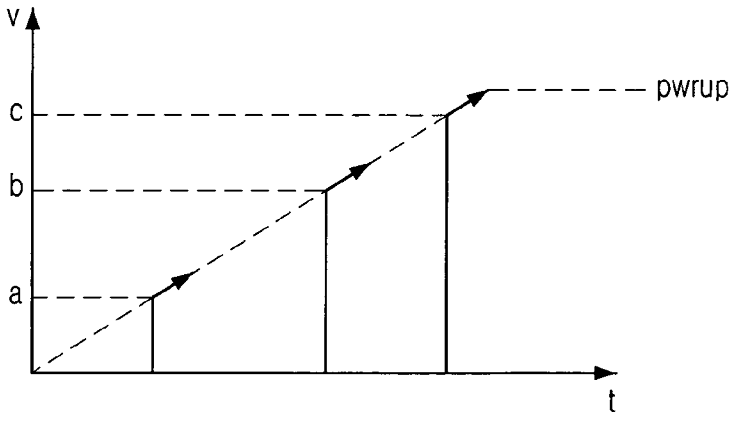
FIG. 2 (PRIOR ART)
FIG. 2 shows a waveform diagram for operation of a circuit in FIG. 1.

It can be noticed that the power-up signal generating apparatus according to the present invention as shown in FIG. 3 further comprises the reference voltage generating unit 30, the current supplying unit 31 and the current sinking unit 32 compared to the conventional power-up signal generating apparatus as shown in FIG. 1.

It will be described for the inner circuit of each block and its operation.

First, the current supplying unit 31 includes a supply feedback signal generating unit 312 for outputting the portion of the voltage on the node ND1 as a feedback signal fd1, a supply comparing unit 310 for comparing the reference voltage Vref to the feedback signal fd1 to output a control signal ctr1, and a supply driver 311 for supplying the current to the node ND1 in response to the control signal ctr1.

Further, the supply comparing unit 310 of the current supplying unit 31 includes an NMOS transistor NM3 having the reference voltage Vref as its gate input and a drain-source path between a node a and a ground voltage VSS to output the voltage on the node a as the control signal ctr1, an NMOS transistor NM4 having the feedback signal fd1 as its gate input and a drain-source path between a node b and the ground voltage VSS, a PMOS transistor PM6 having a drain coupled to its gate input and a source-drain path between the power supply voltage VDD and the node b, and a PMOS transistor PM5 having the voltage on the gate of the PMOS transistor PM6 as its gate input and a source-drain path between the power supply voltage VDD and the node a. The supply driver 311 includes a PMOS transistor PM7 having the control signal ctr1 as its gate input and a source-drain path between the power supply voltage VDD and a node c. The supply feedback signal generating unit 312 includes a resistor R1 between the node c and a node d, a PMOS transistor PM8 having a drain coupled to its gate input and a source-drain path between the node d and the ground voltage VSS to output the voltage on the node d as the feedback signal fd1.

Next, the current sinking unit 32 includes a sink feedback generating unit 322 for outputting the portion of the voltage on the node ND1 as a feedback signal fd2, a sink comparing unit 320 for comparing the reference voltage Vref to the feedback signal fd2 to output a control signal ctr2, and a sink driver 321 to sink the current from the node ND1 in response to the control signal ctr2.

The current comparing unit 320 of the current sinking unit 32 includes a PMOS transistor PM9 having the reference voltage Vref as its gate input and a source-drain path between the power supply voltage VDD and a node e to output the voltage on the node e as the control signal ctr2, a PMOS transistor PM10 having the feedback signal fd2 as its gate input and a source-drain path between the power supply voltage VDD and a node f, an NMOS transistor NM6 having a drain f coupled to its gate input and a drain-source path between the node f and the ground voltage VSS, and an NMOS transistor NM5 having the voltage on the gate of the NMOS transistor NM6 as its gate input and a drain-source path between the node e and the ground voltage VSS. The sink feedback signal generating unit 322 includes a resistor R2 between the power supply voltage VDD and a node g to output the voltage on the node g as the feedback signal fd2, and a PMOS transistor PM11 having a drain coupled to its gate input and a source-drain path between the node g and the node h. The sink driver 321 includes an NMOS transistor NM7 having the control signal ctr2 as its gate input and a drain-source path between the node h and the ground voltage VSS.

For the reference, the node c and the node h are the same node as the node ND1. The reference voltage generating unit 30 is formed by a BJT(Bipolar Junction Transistor) so as to supply the reference voltage Vref having a constant level regardless of the surrounding temperature.

Table 1 shows change on each node in the power-up signal generating apparatus versus temperature.

Further, when the surrounding temperature is lower than room temperature, the level of the threshold voltage Vt of the MOS transistor rises up so that the voltage levels of the feedback signals fd1, fd2 are made to be higher than the reference voltage Vref. The comparing units 310, 320 for comparing the feedback signals fd1, fd2 to the reference voltage, respectively, increases the voltage levels Vctr1, Vctr2 of the control signals ctr1, ctr2. In turn, the supply driver 311 under control of the control signal ctr1 supplies less amount of the current $i_{PM7}$ to the node ND1, while the sink driver NM7 under control of the control signal ctr2 sinks more amount of the current $i_{NM7}$ from the node ND1. Accordingly, the voltage level on the node ND1 is decreased. That is, the voltage level of the bias signal falls down.

Accordingly, the turn-on resistance of the NMOS transistor NM2, which fell down due to the surrounding temperature, is increased.

For the reference, when temperature rises up, the turn-on resistance values of the PMOS transistors PM2, PM3 in the sensing level adjusting unit 11 are decreased due to the level variation of the threshold voltage Vt of the MOS transistor because of change of the surrounding temperature. On the

TABLE 1

| | Current supplying unit | | | Current sinking unit | | | | Resistance | |
|---|---|---|---|---|---|---|---|---|---|
| Temperature | Vfd1 | Vctr1 | $i_{PM7}$ | Vfd2 | Vctr2 | $i_{NM7}$ | Vbias | PM2, PM3 | NM2 |
| increase (inc) | dec | dec | inc | dec | dec | dec | inc | dec | dec |
| decrease (dec) | inc | inc | dec | inc | inc | inc | dec | inc | inc |

Referring to Table 1, it will be described for the operation of the power-up signal generating apparatus in accordance with one embodiment of the present invention.

When the voltage levels of the reference voltage Vref and the feedback signals fd1, fd2 are equal to each other, the current supplying unit 31 and the current sinking unit 32 are deactivated so that the bias signal is outputted having a certain level by the NMOS transistor NM2.

First, it will be described for the operation when the surrounding temperature around the semiconductor device is higher than room temperature.

Due to rising of the surrounding temperature, the level of the threshold voltage Vt of the MOS transistor falls down so that the voltage levels of the feedback signals fd1, fd2 fall under the reference voltage Vref. Each of the comparing units 310, 320 for comparing the feedback signals fd1, fd2 to the reference voltage, respectively, decrease the voltage levels of the control signals ctr1, ctr2. In turn, the supply driver PM7 under control of the control signal ctr1 responds to the control signal ctr1 to supply more amount of the current $i_{PM7}$ to the node ND1, while the sink driver NM7 under control of the control signal ctr2 sinks less amount of the current $i_{NM7}$ from the node ND1. Because more amount of the current $i_{PM7}$ is supplied to the node ND1 by the supply driver PM7 while less amount of the current $i_{NM7}$ is sunk from the node ND1 by the sink driver NM7, the voltage level on the node ND1 is increased, accordingly. That is, the voltage level of the bias signal rises. Accordingly, increase of the turn-on resistance of the NMOS transistor NM2 having the bias signal as its gate input is reduced to activate the power-up signal pwrup at a certain level.

contrary, when temperature falls down, the turn-on resistance values of the PMOS transistors PM2, PM3 are increased.

As described above, the power-up generating apparatus in accordance with one embodiment of the present invention generates the reference voltage Vref that is not impacted by the surrounding temperature variation and adjusts the voltage level Vbias of the bias signal by controlling the amount of the current $i_{PM7}$, $i_{NM7}$ that are supplied to the node ND1 through the current supplying unit 31 and the current sinking unit 32 depending on the surrounding temperature. Therefore, the power-up signal pwrup is activated at a certain level of the power supply voltage VDD by adjusting the turn-on resistance value of the NMOS transistor NM2 so that the chip reliability can be improved.

The present application contains subject matter related to Korean patent application No. 2003-76906, filed in the Korean Patent Office on Oct. 31, 2003, the entire contents of which being incorporated herein by reference.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A power-up signal generating apparatus comprising:

a reference voltage generating means for generating a reference voltage;

a bias level adjusting means receiving the reference voltage as an input for controlling a voltage level of a bias signal in a constant level, the bias level adjusting means including:

a current supplying unit for receiving the reference voltage for supplying a first current varying on a temperature to a first node; and a current sinking unit for receiving the reference voltage for sinking a second current varying on a temperature from the first node;

a bias signal generating unit for generating the bias signal in response to a difference between the first current and the second current; and a signal outputting means for outputting a power-up signal depending on the voltage level of the bias signal, wherein the first current is increased in proportion to the temperature and the second current is decreased in proportion to the temperature.

2. The power-up signal generating apparatus of claim 1, wherein the current supplying unit includes:

a first feedback signal generating unit for outputting a portion of the voltage on the first node as a first feedback signal;

a first comparing unit for comparing the first feedback signal to the reference voltage to output a first control signal; and a first driver for supplying the first current to the first node in response to the first control signal.

3. The power-up signal generating apparatus of claim 2, wherein the current sinking unit includes:

a second feedback signal generating unit for outputting a portion of the voltage on the first node as a second feedback signal;

a second comparing unit for comparing the second feedback signal to the reference voltage to output a second control signal; and a second driver for sinking the second current from the first node in response to the second control signal.

4. The power-up signal generating apparatus of claim 3, wherein the signal outputting unit includes:

a sensing level adjusting unit for adjusting the voltage level of a second node sensing a voltage level of a first power voltage; and an output signal forming unit for outputting the voltage on the second node as a power-up signal.

5. The power-up signal generating apparatus of claim 4, wherein the first feedback signal generating unit is formed by serially coupling a first resistor and a first MOS transistor having a drain coupled to a gate input, the first MOS transistor is located between the first node and a second power voltage, and the voltage on the first MOS transistor is outputted as the first feedback signal.

6. The power-up signal generating apparatus of claim 4, wherein the second feedback signal generating unit is formed by serially coupling a second resistor and a second MOS transistor having a drain coupled to a gate input, the second MOS transistor is located between the first power voltage and the first node, and the voltage on the connect node between the second resistor and the second MOS transistor is outputted as the second feedback signal.

7. The power-up signal generating apparatus of claim 5, wherein the first comparing unit is formed with a first current mirror type differential amplifier having the reference voltage and the first feedback signal as inputs.

8. The power-up signal generating apparatus of claim 6, wherein the second comparing unit is formed with a second current mirror type differential amplifier having the reference voltage and the second feedback signal as inputs.

9. The power-up signal generating apparatus of claim 7, wherein the first driver is formed with a third MOS transistor having the first control signal as a gate input and a drain-source path between the first power voltage and the first node.

10. The power-up signal generating apparatus of claim 8, wherein the second driver is formed with a fourth MOS transistor having the second control signal as a gate input and a drain-source path between the second power voltage and the first node.

11. The power-up signal generating apparatus of claim 9, wherein the bias generating unit includes:

a fifth MOS transistor having the second power voltage as a gate input and a drain-source path between the first power voltage and the first node; and a sixth MOS transistor having the voltage on the first node as a gate input and a drain-source path between the first node and the second power voltage to output the voltage on the first node as the bias signal.

12. The power-up signal generating apparatus of claim 11, wherein the sensing level adjusting unit is formed with a seventh MOS transistor and an eighth MOS transistor, each having a drain coupled to a gate input, serially coupled between the first power voltage and the second node.

13. The power-up signal generating apparatus of claim 12, wherein the output signal forming unit includes:

a ninth MOS transistor having the bias signal as a gate input and a drain-source path between the second node and the second power voltage;

a first inverter for inverting the voltage on the second node;

a tenth MOS transistor having the output signal of the first inverter as a gate input and a drain-source path between the first power voltage and the second node; and a second inverter for inverting the output signal of the first inverter to output as the power-up signal.

14. The power-up signal generating apparatus of claim 13, wherein the reference voltage generating unit is formed with a BJT(Bipolar Junction Transistor) to generate the reference voltage having a constant level regardless of any external factor.

15. The power-up signal generating apparatus of claim 14, wherein the first current mirror type differential amplifier includes:

a first NMOS transistor having the reference voltage as a gate input and a drain-source path between a third node and the second power voltage to output the voltage on the third node as the first control signal;

a second NMOS transistor having the first feedback signal as a gate input and a drain-source path between a fourth node and the second power voltage;

a first PMOS transistor having a voltage on a drain coupled to a gate input and a drain-source path between the first power voltage and the fourth node; and a second PMOS transistor having the voltage on the gate of the first PMOS transistor as a gate input and a drain-source path between the first power voltage and the third node.

16. The power-up signal generating apparatus of claim 14, wherein the second current mirror type differential amplifier includes:

a third PMOS transistor having the reference voltage as a gate input and a drain-source path between the first power voltage and a fifth node to output the voltage on the fifth node as the second control signal;

a fourth PMOS transistor having the second feedback voltage as a gate input and a drain-source path between the first power voltage and the sixth node;

a third NMOS transistor having a drain coupled to a gate input and a drain-source path between the sixth node and the second power voltage; and a fourth NMOS transistor having the gate voltage of the third NMOS transistor as a gate input and a drain-source path between the fifth node and the second power voltage.

17. The power-up signal generating apparatus of claim 15, wherein the first, the second, the third, the fifth, the seventh, the eighth and the tenth MOS transistors are formed with PMOS transistors, and the fourth, the sixth and the ninth transistors are formed with NMOS transistors.

18. The power-up signal generating apparatus of claim 10, wherein the bias generating unit includes:

a fifth MOS transistor having the second power voltage as a gate input and a drain-source path between the first power voltage and the first node; and a sixth MOS transistor having the voltage on the first node as a gate input and a drain-source path between the first node and the second power voltage to output the voltage on the first node as the bias signal.

19. The power-up signal generating apparatus of claim 18, wherein the sensing level adjusting unit is formed with a seventh MOS transistor and an eighth MOS transistor, each having a drain coupled to a gate input, serially coupled between the first power voltage and the second node.

20. The power-up signal generating apparatus of claim 19, wherein the output signal forming unit includes:

a ninth MOS transistor having the bias signal as a gate input and a drain-source path between the second node and the second power voltage;

a first inverter for inverting the voltage on the second node;

a tenth MOS transistor having the output signal of the first inverter as a gate input and a drain-source path between the first power voltage and the second node; and a second inverter for inverting the output signal of the first inverter to output as the power-up signal.

21. The power-up signal generating apparatus of claim 20, wherein the reference voltage generating unit is formed with a BJT(Bipolar Junction Transistor) to generate the reference voltage having a constant level regardless of any external factor.

22. The power-up signal generating apparatus of claim 21, wherein the first current mirror type differential amplifier includes:

a first NMOS transistor having the reference voltage as a gate input and a drain-source path between a third node and the second power voltage to output the voltage on the third node as the first control signal;

a second NMOS transistor having the first feedback signal as a gate input and a drain-source path between a fourth node and the second power voltage;

a first PMOS transistor having a voltage on a drain coupled to a gate input and a drain-source path between the first power voltage and the fourth node; and a second PMOS transistor having the voltage on the gate of the first PMOS transistor as a gate input and a drain-source path between the first power voltage and the third node.

23. The power-up signal generating apparatus of claim 21, wherein the second current mirror type differential amplifier includes:

a third PMOS transistor having the reference voltage as a gate input and a drain-source path between the first power voltage and a fifth node to output the voltage on the fifth node as the second control signal;

a fourth PMOS transistor having the second feedback voltage as a gate input and a drain-source path between the first power voltage and the sixth node;

a third NMOS transistor having a drain coupled to a gate input and a drain-source path between the sixth node and the second power voltage; and a fourth NMOS transistor having the gate voltage of the third NMOS transistor as a gate input and a drain-source path between the fifth node and the second power voltage.

24. The power-up signal generating apparatus of claim 22, wherein the first, the second, the third, the fifth, the seventh, the eighth and the tenth MOS transistors are formed with PMOS transistors, and the fourth, the sixth and the ninth transistors are formed with NMOS transistors.

25. The power-up signal generating apparatus of claim 1, wherein the reference voltages input to the current supplying unit and the current sinking unit are identical.

* * * * *